United States Patent [19]

Needham et al.

[11] Patent Number: 4,560,580

[45] Date of Patent: Dec. 24, 1985

[54] PROCESS FOR ENCAPSULATING ARTICLES WITH OPTIONAL LASER PRINTING

[75] Inventors: Donald G. Needham; John E. Leland, both of Bartlesville, Okla.

[73] Assignee: Phillips Petroleum Company, Bartlesville, Okla.

[21] Appl. No.: 590,824

[22] Filed: Mar. 19, 1984

Related U.S. Application Data

[62] Division of Ser. No. 429,738, Sep. 30, 1982, Pat. No. 4,443,571.

[51] Int. Cl.⁴ .......................... B05D 3/06; B05D 5/12
[52] U.S. Cl. ..................................... 427/53.1; 427/79; 427/96; 427/101; 427/398.1; 430/286
[58] Field of Search ................ 427/53.1, 79, 96, 101, 427/398.1, 213.31

[56] References Cited

U.S. PATENT DOCUMENTS

| | | | |
|---|---|---|---|
| 1,926,447 | 8/1931 | Lederle et al. | 134/67 |
| 2,396,327 | 3/1946 | Kvalnes et al. | 260/146 |
| 2,844,581 | 7/1958 | Manger et al. | 260/279 |
| 3,351,948 | 11/1967 | Bonn | 430/945 X |
| 3,354,129 | 11/1967 | Edmonds, Jr. et al. | 528/265 |
| 3,884,705 | 5/1975 | Blair | 524/407 |
| 4,024,148 | 5/1977 | Tyson et al. | 524/90 |
| 4,080,355 | 3/1978 | Le Pape | 524/90 |
| 4,127,421 | 11/1978 | Ferrill | 524/407 |
| 4,266,006 | 5/1981 | Uhlig et al. | 427/96 X |
| 4,337,182 | 6/1982 | Needham | 524/609 |

FOREIGN PATENT DOCUMENTS

| | | |
|---|---|---|
| 0011105 | 5/1980 | European Pat. Off. . |
| 0062806 | 10/1982 | European Pat. Off. . |
| 2652646 | 5/1978 | Fed. Rep. of Germany . |
| 3242157 | 8/1983 | Fed. Rep. of Germany ...... 427/101 |
| 0146867 | 11/1979 | Japan ..................................... 427/96 |
| 1592930 | 7/1981 | United Kingdom . |
| 2073947 | 10/1981 | United Kingdom .................. 427/96 |

OTHER PUBLICATIONS

Plastics World, Mar. 1979, pp. 58–61, "Additives-1979".
Plastics World, Jul. 1977, pp. 44–47, "Additives for Plastics-1977".
Series 920 Data "Laser Mark" from Lumonics, Canada Laser Marking System.

Primary Examiner—Richard D. Lovering
Attorney, Agent, or Firm—French and Doescher

[57] ABSTRACT

Articles, such as electrical circuits or elements, are encapsulated by melting polyarylene sulfide in combination with at least one print compound such as monazo-nickel complex, lead chromate-lead molybdate, quinacridone, Ni—Sb—Ti, Co—Zn—$SiO_2$ or lead chromate, injecting this molten composition around the article to be encapsulated, and cooling and solidifying the molten composition. The articles may latter be laser printed.

5 Claims, No Drawings

PROCESS FOR ENCAPSULATING ARTICLES WITH OPTIONAL LASER PRINTING

This is a divisional application of Ser. No. 429,738, filed Sept. 30, 1982, now U.S. Pat. No. 4,443,571.

BACKGROUND OF THE INVENTION

Polyphenylene sulfide is a plastic which, due to its stability at high temperatures and its resistance against various chemicals, has found ever broadening areas of applications. Among these applications are the use of polyarylene sulfide as an encapsulating material for electrical circuits or other electrical elements, particularly in view of the outstanding electrical properties of polyarylene sulfide.

For these and other applications of polyarylene sulfide, printing of the polymer surface sometimes constitutes a problem. Specifically, it is desirable to print characterizing features or codes on such surfaces which cannot be readily removed or erased, and to obtain these imprints in good contrast.

Laser printing is a technique that had been developed for permanent printing on certain surfaces.

THE INVENTION

It is thus one object of this invention to provide laser printable surfaces from novel polyarylene sulfide compositions.

Another object of this invention is to provide a composition that furnishes a surface which can be printed by exposure to laser beams resulting in relatively high contrast prints on the surface.

A further object of this invention is to provide a process to print on a polyarylene sulfide surface.

Yet another object of this invention is to provide a process to produce an electric element encapsulated in polyarylene sulfide.

These and other objects, advantages, details, features and embodiments of this invention will become apparent to those skilled in the art from the following detailed description of the invention and the appended claims.

In accordance with this invention it has now been discovered that the following compounds when added in varying concentrations render the surfaces of molded polyarylene sulfide compositions laser printable with good contrast:
1. Monoazo-nickel complex (yellow)
2. Lead chromate-lead molybdate (red)—(PbCrO$_4$)/PbMoO$_4$
3. Quinacridone (red)
4. Nickel-antimony-titanium (yellow)—NiSbTi
5. Cobalt-zinc-silica (blue)—CoSiZn
6. Lead chromate (yellow)—PbCrO$_4$ These compounds are hereinafter also collectively referred to as "print compounds".

In this invention the surfaces to be laser printed on are preferably polyarylene sulfide molded articles. As used herein "molded" includes injection molding, extrusion, pultruded, vacuum formed, cast, blowmolded, rotational molded, etc.

More specifically and in accordance with a first embodiment of this invention, a composition is provided which comprises the following ingredients the broad ranges represent the ranges within which the composition should be confined in order to obtain good results, the preferred ranges are preferred because they define a composition possessing the physical, chemical and electrical properties best suited for its intended encapsulation purposes:

| Ingredient | Broad Range Parts by Weight | Preferred Range Parts by Weight |
| --- | --- | --- |
| Polyarylene sulfide | 100 | 100 |
| Print compounds | .9 to 12 | 3 to 6 |
| Filler | 140 to 220 | 160 to 200 |
| Coupling agent | .7 to 6 | 1.5 to 3 |
| Processing aid | .3 to 3 | .7 to 1.4 |
| Corrosion inhibitor | 0 to 6 | 1.4 to 4 |

The corrosion inhibitor is optional in the composition but may be added to provide mold and encapsulated component protection.

POLYARYLENE SULFIDE

Without being limited thereto, uncured or partially cured poly(arylene sulfide) whether homopolymer, copolymer, terpolymer, and the like, or a blend of such polymers, can be used in the practice of the invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein. Examples of poly(arylene sulfide) polymers suitable for purposes of the invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide). Various poly(arylene sulfides) are commercially available under the trademark Ryton ® from Phillips Petroleum Company, Bartlesville, Okla.

THE PRINT COMPOUNDS

The six print compounds useful in accordance with this invention to provide laser printable polyarylene sulfide compositions are commercially available products. The following tabulation gives a supplier and trademark for each of the print compounds.

| Print Compound | Supplier | Trademark | Reference |
| --- | --- | --- | --- |
| 1. Nickel-monoazo complex | Harmon Color Co. | Fanchon Fast Yellow Y-5694 | Color #12775, Pigment Green 10 (para chloroaniline → 2,4-quinoline diol → nickel complex); U.S. 2,396,327 |
| 2. Lead chromate-lead molybdate | Dupont | Krolor KR980D (Red) | Mixture of Violet 19 and Red 104 PbCrO$_4$/PbMoO$_4$; Color index number 46500 and 77605; Violet 19: U.S. 2,844,484; U.S. 2,844,485; U.S. 2,844,581 Red 104: U.S. 1,926,447 |
| 3. Quinacridone | Sun Chemical Co. | 228-0022 | Violet 19; Color Index 46500 |

| Print Compound | Supplier | Trademark | Reference |
|---|---|---|---|
| | | (Red) | Violet 19: U.S. 2,844,484; U.S. 2,844,485; U.S. 2,844,581 |
| 4. Nickel-antimony-titanium | Shepherd Chemical Co. | Shepherd #14 (Yellow) | Pigment Yellow #150; made from oxides of the metals plus heating |
| 5. Cobalt-zinc-silica | Ferro Chemical Co. | V9223 (Blue) | Major components are metal oxides calcined at 1200 to 2300° F. |
| 6. Lead chromate | Dupont | Krolor KY788D (Yellow) | $PbCrO_4$ |

FILLER

Various fillers can be used for the composition of this invention. Typical fillers include fiberglass, talc, titanium dioxide, silica and calcium sulfate. Most preferably the composition of this invention contains one or more of the fillers fiberglass, talc and titanium dioxide.

COUPLING AGENT

In accordance with the preferred embodiment of the invention the composition comprises a poly(arylene sulfide) (such as, for example, a poly(phenylene sulfide) and at least one mercaptosilane, such as, for example, the preferred 3-mercaptopropyltrimethoxysilane. This silane is preferred because of its extraordinary utility as a coupling agent.

OTHER ADDITIVES

The composition of this invention optionally contains other additives such as processing aids (e.g. mold release agents), corrosion inhibitors, and stabilizers. It is presently preferred to incorporate a mold release agent into the composition of this invention, particularly when the composition is intended for molding, e.g. in an encapsulation operation. Polyethylene and zinc stearate are examples of useful mold release agents. Corrosion inhibitors are also advantageously contained in the composition, particularly when this composition is used in molding operations such as encapsulation. An example of a corrosion inhibitor is lithium carbonate.

PRODUCTION

The composition of this invention is preferably in the form of a powder or in the form of pellets. The ingredients are most preferably dry blended and then extruded into pellets or otherwise molten and converted into powder. The melting or extrusion is carried out at temperatures above the melting point of the polyarylene sulfide and usually at a temperature in the range of about 550° to 650° F.

LASER PRINTING

Another embodiment of this invention resides in a printing process. In this process a surface of a molded composition as defined above is exposed to a pattern of laser radiation such as to change the irradiated surface as compared to the non-irradiated surface and to generate a preferably visible mark corresponding to the pattern of irradiation on the surface. A laser printer, Laser Mark 920, was used as described in the example and is commercially available from Lumonics, Inc., Kanata, Canada. Generally, the pattern is generated by passing the laser radiation through a stencil. The exposure time is usually short, in the order of microseconds and the depth of the material affected is small, usually in the order of a mil or less using a power range of the laser on the order of 1-10 joules, preferably 3 joules over an area of about 0.03125 sq. inches. The specific print compounds used in the compositions of this invention which cause laser printability with good contrast may involve different mechanisms such as mechanical and/or chemical changes in the composition near the surface. Applications do not wish to be bound, however, by any such theory. It should be understood that good contrast is a matter of interpretation and may comprise a light pigmented resin composition which changes to dark areas under laser exposure or vice versa. Also under varying energy levels of the laser the resin color may initially be changed to a lighter color such as at 3 joules energy then to a darker color such as at 10 joules energy. The initial resin pigmentation or color (light or dark) is also based on pigments concentrations and resin formulations which can vary over a wide range.

ENCAPSULATION

The most preferred use of the compositions of this invention is for encapsulation of electrical elements, suchh as integrated circuits, capacitors, resistor networks, and the like. This encapsulation is achieved by flowing the composition of this invention as a melt in a mold over the electric element to be encapsulated while protecting the connecting leads from being coated. The molten composition is allowed to solidify in the mold and then the encapsulated element is removed from the mold. By this process, which uses the novel composition of this invention, an encapsulated electrical element is produced which can readily and readably be printed upon with laser radiation. It is within the scope of this invention to carry out the laser printing following the encapsulation and most preferably directly in the mold prior to removal of the encapsulated element.

The encapsulation steps are generally carried out by injecting the composition of this invention into the mold containing the electrical elements. The temperature for this step will be preferably in the range of 575° to 675° F., and also based on the electrical component being encapsulated but it will be sufficiently above the melting point of the polyarylene sulfide to allow adequate flow of the composition into the mold and around the electrical element or elements.

Although the invention is not limited thereto the viscosity of the composition used for encapsulation of active components should not exceed about 800 poise. Encapsulation of active electronic components with compositions having viscosities in excess of about 800 poise can cause damage to the components. It is contemplated that the viscosity of the composition will generally range from about 150 to about 500 poise for active components other than very delicate components such as, for example, integrated circuits with wire leads. With respect to very delicate components such as, for example integrated circuits with wire leads the viscosity of the encapsulation composition should be below about 150 poise. Encapsulation of integrated circuits with compositions any higher in viscosity can cause wire wash (i.e., breaking of the wires of the integrated circuit). It is contemplated that the viscosity of the composition for the encapsulation of such integrated circuits and the like will generally range from about 75 to about 150 poise.

Although viscosity of the composition depends on a number of factors, to obtain composition viscosities below about 800 poise the viscosity of the poly(arylene sulfide) contemplated in encapsulation of active components should generally not exceed about 130 poise. It is contemplated that the viscosity of the poly(arylene sulfide) will, in most applications, range up to about 70 poise. To obtain composition viscosities within the desired range for delicate active components such as, for example, integrated circuits with wire leads the viscosity of the poly(arylene sulfide) should generally be less than about 25 poise.

Although the invention is not limited thereto the viscosity of the composition used for encapsulation of passive components should not exceed about 1200 poise. Encapsulation of passive electronic components with compositions having viscosities in excess of about 1200 poise can cause damage to the components. It is contemplated that the viscosity of the composition will generally range from about 500 to about 800 poise.

To obtain composition viscosities within the desired ranges the viscosity of the poly(arylene sulfide) contemplated in encapsulation of passive components should not exceed about 300 poise. It is contemplated that the viscosity of the poly(arylene sulfide) will generally range from about 190 to about 300 poise.

The viscosities mentioned above are determined on a capillary rheometer at 650° F. and at a shear rate of 1000 sec$^{-1}$.

The following examples are intended to further illustrate the invention without unduly limiting its scope.

EXAMPLE I

The ingredients of the following recipe were dry blended and thereafter the composition was extruded in a Buss-Conduit Kneader feeding a crosshead extruder and pellets of the composition were recovered.

|  | Weight Percent | Parts by Weight |
|---|---|---|
| Polyphenylene sulfide[1] | 35 | 100 |
| Fiberglass[2] | 35 | 100 |
| Talc[3] | 11.75 | 33.6 |
| Titanium dioxide[4] | 15 | 42.9 |
| Nickel mono-azo complex[5] | 2 | 5.7 |
| Silane[6] | 1 | 2.9 |
| Processing aid[7] | 0.25 | 0.7 |

[1]Commercially available under the trademark Ryton ® from Phillips Petroleum Company, Bartlesville, Oklahoma.
[2]Commercially available under Grade 193 from Owens-Corning, Amarillo, Texas.
[3]Commercially available under type 2620 talc from Ribelin, Dallas, Texas.
[4]Commercially available under the trademark Unitane 0-110 from Cyanamid.
[5]Commercially available from Harmon Chemical Co., Hawthorne, N.J. under the trademark Harmon Y-5694.
[6]Commercially available under the trademark A-189 from Union Carbide or trademark 6032 Dow Chemical Co.
[7]Polyethylene commercially available under the trademark Marlex EMN-TR885 from Phillips Petroleum Company, Bartlesville, Oklahoma.

The color of the composition was golden yellow. The pellets were used to encapsulate electric circuits with satisfactory results. Laser printing of the encapsulated circuit resulted in markings having a purplish color with good contrast.

EXAMPLES 2-6

The ingredients of the recipe in Example I were blended in the concentrations listed using, however, instead of the nickel monoazo complex those compositions listed in the following table. The changes in color due to laser energy exposure are listed.

| Example | Pigment | Composition Color | Encapsulation Results | Resultant Laser Print Color |
|---|---|---|---|---|
| 2 | Lead chromate-lead molybdate | light brown | satisfactory | light yellow |
| 3 | Quinacridone | dark purple | satisfactory | light green |
| 4 | Nickel-antimony-titanium | light tan | satisfactory | light yellow |
| 5 | Cobalt-zinc-silica | gray | satisfactory | white |
| 6 | Lead chromate | gray-tan | satisfactory | light yellow |

All the above listed pigments showed good contrast, while a variety of other pigments were ineffectual in exhibiting good contrast under laser energy exposure. For example: chromium oxide (green) blended in accordance with example 1 recipe in place of ingredient 5 and at a 1 weight percent concentration when exposed to 3 joules laser energy resulted in poor contrast. The chromium oxide is commercially available from Pfizer Co. under the pigment number G4099.

Reasonable variations and modifications which will become apparent to those skilled in the art can be made in this invention without departing from the spirit and scope thereof.

What is claimed is:
1. Process to encapsulate articles comprising
   (a) melting a composition comprising polyarylene sulfide and at least one print compound selected from the group consisting of
      monoazo-nickel complex
      lead chromate-lead molybdate
      quinacridone
      nickel-antimony-titanium
      cobalt-zinc-silica and
      lead chromate
   (b) injecting the so molten composition around the article to be encapsulated,
   (c) cooling the composition surrounding the article to be encapsulated, and solidifying said molten composition to form said encapsulated article.
2. Process in accordance with claim 1 wherein said article is selected from the group consisting of electrical circuits and elements and wherein the electrical connector or connectors of said article are protected from being covered with said composition.
3. A process in accordance with claim 1 comprising arranging said article inside of an injection mold and injecting said molten composition into said injection mold.
4. Process in accordance with claim 1 further comprising subjecting the surface of the solidified encapsulating material to a pattern of laser light irradiation such as to modify the surface of the composition in all the areas exposed to said laser light.
5. Process in accordance with claim 4 wherein said laser light irradiation is carried out for a time sufficient to generate a pattern legible for the human eye.

* * * * *